United States Patent
Hengelein et al.

(10) Patent No.: US 10,684,338 B2
(45) Date of Patent: Jun. 16, 2020

(54) METHOD AND MAGNETIC RESONANCE APPARATUS TO SUPPORT PLANNING OF A MAGNETIC RESONANCE EXAMINATION ON A PATIENT

(71) Applicant: Siemens Healthcare GmbH, Erlangen (DE)

(72) Inventors: Bernd Hengelein, Neunkirchen a. Br. (DE); Kirstin Jattke, Nuremberg (DE); Christof Krellmann, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 127 days.

(21) Appl. No.: 15/903,472

(22) Filed: Feb. 23, 2018

(65) Prior Publication Data

US 2018/0246181 A1    Aug. 30, 2018

(30) Foreign Application Priority Data

Feb. 24, 2017   (DE) ................. 10 2017 203 025

(51) Int. Cl.
*G01R 33/54* (2006.01)
*G01R 33/483* (2006.01)
*G01R 33/56* (2006.01)

(52) U.S. Cl.
CPC ....... *G01R 33/543* (2013.01); *G01R 33/4833* (2013.01); *G01R 33/5608* (2013.01); *G01R 33/546* (2013.01)

(58) Field of Classification Search
CPC .............. G01R 33/543; G01R 33/4833; G01R 33/5608

USPC ........................................................ 324/307
See application file for complete search history.

(56) References Cited

U.S. PATENT DOCUMENTS

| | | | |
|---|---|---|---|
| 7,051,286 B1 | 5/2006 | Stemmer et al. | |
| 9,259,290 B2* | 2/2016 | Jenkins | A61B 34/20 |
| 10,049,447 B2* | 8/2018 | Lloyd | G06K 9/0014 |
| 2003/0095147 A1* | 5/2003 | Daw | G01R 33/56 |
| | | | 715/771 |
| 2004/0097806 A1* | 5/2004 | Hunter | A61B 1/00071 |
| | | | 600/434 |
| 2004/0171924 A1* | 9/2004 | Mire | G16H 50/50 |
| | | | 600/407 |
| 2007/0167730 A1* | 7/2007 | Tatebayashi | G01R 33/4833 |
| | | | 600/410 |
| 2007/0191703 A1 | 8/2007 | Graf | |
| 2009/0213034 A1* | 8/2009 | Wu | G16H 40/63 |
| | | | 345/1.1 |
| 2010/0195919 A1* | 8/2010 | Coste-Maniere | G06T 7/30 |
| | | | 382/224 |
| 2010/0295848 A1* | 11/2010 | Grewer | G06T 7/11 |
| | | | 345/419 |
| 2010/0329529 A1* | 12/2010 | Feldman | G06K 9/6252 |
| | | | 382/131 |

(Continued)

*Primary Examiner* — Patrick Assouad
*Assistant Examiner* — Demetrius R Pretlow
(74) *Attorney, Agent, or Firm* — Schiff Hardin LLP

(57) ABSTRACT

In a method and magnetic resonance apparatus to support planning of a magnetic resonance examination on a patient with the magnetic resonance apparatus, a planning image is displayed and at least one graphic protocol object is superimposed thereon for a user. Information is thereby shown to the user as to whether at least one graphic protocol object is displayed outside the section of the planning image.

6 Claims, 3 Drawing Sheets

(56) References Cited

U.S. PATENT DOCUMENTS

| | | | |
|---|---|---|---|
| 2012/0226141 A1* | 9/2012 | Shinoda | G01R 33/48 600/419 |
| 2012/0310078 A1 | 12/2012 | Harder et al. | |
| 2013/0172731 A1* | 7/2013 | Gole | A61B 5/0035 600/424 |
| 2013/0281831 A1* | 10/2013 | Riederer | A61B 5/055 600/420 |
| 2014/0177803 A1* | 6/2014 | Stevens | A61B 6/52 378/98 |
| 2015/0139514 A1* | 5/2015 | Mohr | G06T 5/50 382/131 |
| 2015/0356271 A1* | 12/2015 | Kozuka | G06F 16/5838 705/2 |
| 2016/0210511 A1* | 7/2016 | Leong | G06K 9/00624 |
| 2017/0172663 A1* | 6/2017 | Popovic | G06T 7/30 |
| 2017/0202625 A1* | 7/2017 | Bharat | A61B 8/12 |
| 2017/0213524 A1* | 7/2017 | Tsunamoto | G16H 30/20 |
| 2017/0299677 A1* | 10/2017 | Dimitrov | A61B 5/055 |
| 2018/0078786 A1* | 3/2018 | Vik | A61N 5/103 |

* cited by examiner

METHOD AND MAGNETIC RESONANCE APPARATUS TO SUPPORT PLANNING OF A MAGNETIC RESONANCE EXAMINATION ON A PATIENT

BACKGROUND OF THE INVENTION

Field of the Invention

The present invention concerns a method to support planning of a magnetic resonance examination on a patient with a magnetic resonance apparatus, wherein at least one graphic protocol object is superimposed and/or represented in a planning image for a user.

Description of the Prior Art

The planning of a magnetic resonance examination, in particular of a magnetic resonance protocol, on a patient preferably ensues with the use of existing image data relating to the patient, in particular of overview images or sections of overview images relating to the patient. For example, protocol information is superimposed and/or represented as graphic protocol objects in the overview images or the sections of the overview images. Often, however, the image section that is depicted, by which the planning of the magnetic resonance protocol is visualized for a user, is not adjusted to the size of the graphic protocol object. In particular, the size of the section is far too small, such that the user, in particular an inexperienced user, does not receive any indication that a slice that is to be acquired is located outside the relevant section. This can lead to image data being acquired that are diagnostically not relevant or which have no meaning, so at least part of the magnetic resonance examination has to be repeated.

U.S. Pat. No. 7,051,286 B1 discloses a method for adjusting measurement parameters for a subsequent magnetic resonance examination.

DE 10 2006 007 057 B4 describes a method for acquiring magnetic resonance slice images of an examination object by means of a magnetic resonance facility. A control facility of the magnetic resonance apparatus is designed to determine a volume of the examination object using the acquisition of an overview image of the examination object and, as a function of the result of the acquisition, so as to adjust at least one image acquisition parameter.

SUMMARY OF THE INVENTION

An object of the present invention is to represent graphic protocol objects inside a section of a planning image for planning a magnetic resonance examination on a patient.

The method according to the invention to support planning of a magnetic resonance examination on a patient using a magnetic resonance apparatus, has the following process steps. A planning image is provided to a computer, which includes a partial region of the patient that is to be examined. A section of the planning image is depicted at a display screen in communication with the computer. The computer superimposes at least one graphic protocol object on the displayed section of the planning image, and depicts the least one graphic protocol object, insofar as this is arranged inside the section of the planning image. The computer generates relative size information pertaining to the graphic protocol object as a function of a size and/or position of the graphic protocol object in relation to the section of the planning image. The relative size information is shown in the section of the planning image.

For a magnetic resonance examination on a patient, control parameters are typically selected as a function of the examination object and/or of a set of clinical questions, in particular as a function of the cause of the examination, by means of the magnetic resonance apparatus. A set of control parameters, based on which the magnetic resonance apparatus can be activated and image data, in particular magnetic resonance data, can be generated, is referred to as a protocol. The image data generated by the control parameters of a protocol that has been generated preferably have a uniform contrast and preferably depict a partial region of the examination object, in particular of the patient. For a magnetic resonance examination of an examination object, the activation of the magnetic resonance apparatus can also ensue by execution of a number of protocols.

For monitoring and/or having a better overview of the planning of a magnetic resonance examination, the control parameters that have been entered for a magnetic resonance protocol can be depicted for a user, for example, for a medical technician supervising a magnetic resonance examination, in the form of graphic protocol objects in a planning image. For example, in this way, a position and/or orientation of a slice to be measured and/or a slice width and so on can be depicted.

The planning of the magnetic resonance examination ensues by the use of a planning image. The provision of the planning image to the computer can involve retrieving a planning image that is already available and stored. In a particularly advantageous manner, the provision of the planning image can also include acquisition of magnetic resonance data from an overview measurement and/or a localizer-measurement. Here the planning image is preferably generated using the overview measurement and/or the localizer measurement, the overview measurement and/or the localizer measurement being acquired at a lower resolution than the subsequent diagnostic magnetic resonance measurement. The display and/or representation of graphic protocol objects (the term "display" will be used below as synonymous with "representation" and "depiction"), which visualize for a user the protocol parameters that have been set, likewise ensue/ensues by use of the planning image. In accordance with the invention, it is not the entire planning image that is displayed, but a section of the planning image, which contains the partial region that represents the region of the patient's body that is to be examined. Here, the section of the planning image includes the partial region of the planning image that shows the region of the patient's body that is to be examined in an enlarged form, in order, for example, to effectively detect and/or set a position and/or orientation of a slice for the subsequent magnetic resonance measurement.

The relative size information relating to the at least one graphic protocol object includes, for example, an indication and/or information as to whether the at least one graphic protocol object is completely displayed within the section of the planning image that is displayed. In addition, the relative size information for the at least one graphic protocol object can also include an indication and/or information as to whether only part of the at least one graphic protocol object is encompassed in the section of the planning image that is displayed, or is entirely arranged outside the section that is displayed.

As a result, the user is provided with advantageous support in the planning of the magnetic resonance examination. In particular, a contribution can be made in this way to ensuring greater clarity of the planning image for the user. In addition, the user can receive information as to whether the selected section of the planning image is of a useful size for representing the at least one graphic protocol object and thus to plan the magnetic resonance examination. Such information can include the function of a warning. Advantageously, a time-consuming search through graphic protocol objects, which are possibly displayed inside the planning image but not inside that section, can thus be dispensed with.

Furthermore, the invention makes it possible for the user to adjust the section to the size of the at least one graphic protocol object. In addition, workflow in the magnetic resonance examination can be improved such that repetitions of examinations can be avoided, since images and/or magnetic resonance image data from regions that are not diagnostically relevant can be reduced and/or prevented. This can also lead to an improved image quality since a scan time for which the patient has to remain inside a confined patient-accommodating region within the magnetic resonance apparatus can be restricted to a minimum.

In an embodiment, the at least one graphic protocol object includes slice information for a slice that is to be measured in the magnetic resonance examination on the patient. The slice information for the slice that is to be measured can include a position and/or an orientation of the slice that is to be measured. In addition, the slice information can include a slice width and so on for the slice that is to be measured.

In a further embodiment of the invention, the relative size information is displayed to the user indicates whether the section of the planning image is sufficient to completely display the at least one graphic protocol object. As a result, the user can receive information and/or detail as to what percentage of the at least one graphic protocol object is displayed inside the section.

Furthermore, the display of the relative size information can be linked to an input command. Via such an input command, a user can make a simple adjustment of the section of the planning image to the size of the at least one graphic protocol object. In particular, a simple activation of the input command, for example by activation of an input element, such as a computer mouse, the adjustment of the section of the planning image to a size of the at least one graphic protocol object can be achieved.

In another embodiment of the invention, the section of the planning image can be adjusted to the size and/or position of the at least one graphic protocol object when the input command is activated. The adjustment of the section of the planning image to the size and/or position of the at least one graphic protocol object preferably ensues automatically and/or autonomously by operation of a control computer in the magnetic resonance apparatus. As a result, a complex manual adjustment of the section of the planning image to the size and/or position of the at least one graphic protocol object can be avoided, which is advantageous for the user. In addition, the adjustment of the section of the planning image to the size and/or position of the at least one graphic protocol object can ensue in a particularly time-saving manner. Furthermore, this embodiment of the invention makes it possible for a scaling of the section of the planning image that is adjusted to the size of the at least one graphic protocol object to be achieved in a simple manner.

The adjusted section of the planning image is preferably displayed together with the entire graphic protocol object. This allows a simple continuation of the planning of the magnetic resonance examination on the patient.

Furthermore, the invention concerns a magnetic resonance apparatus having a control computer and an output monitor, and the magnetic resonance apparatus is designed to carry out the method according to the invention to support planning of a magnetic resonance examination on a patient.

As a result, advantageous support can be provided to the user in the planning of the magnetic resonance examination. In particular, a contribution can be made in this way to greater clarity of the planning image for the user. In addition, the user can obtain information as to whether the selected section of the planning image is of a size that is useful for representing the at least one graphic protocol object and thus for planning the magnetic resonance examination. Advantageously, a time-consuming search through graphic protocol objects that are possibly depicted inside the planning image but not inside the section can thus be dispensed with.

Furthermore, the design of the inventive apparatus makes it possible for the user to adjust the section to the size of the at least one graphic protocol object. In addition, a workflow in a magnetic resonance examination can be improved in this way such that repetitions of examinations can be avoided since images and/or magnetic resonance image data from regions that are not diagnostically relevant can be reduced and/or prevented. This can also lead to an improved image quality since a scan time for which the patient has to remain within a confined patient-accommodating region within the magnetic resonance apparatus can be restricted to a minimum.

The advantages of the magnetic resonance apparatus according to the invention essentially correspond to the advantages of the method according to the invention to support planning of a magnetic resonance examination on a patient, which have been set out in detail above. Features, advantages or alternative embodiments referred to above are applicable to the apparatus as well.

The present invention also encompasses a non-transitory, computer-readable data storage medium encoded with programming instructions that, when the storage medium is loaded into a computer or computer system of a magnetic resonance apparatus, cause the computer or computer system to operate the magnetic resonance apparatus in order to implement any or all of the embodiments of the method according to the invention, as described above.

Here, the stored computer code may require program peripherals, such as libraries and auxiliary functions, in order to carry out the corresponding embodiments of the method. The programming instructions can be in a source code, which still has to be compiled and linked or just has to be interpreted, or can be an executable software code that only needs to be loaded into a corresponding computer in order to be run.

DESCRIPTION OF THE PREFERRED EMBODIMENTS

Figure 1:
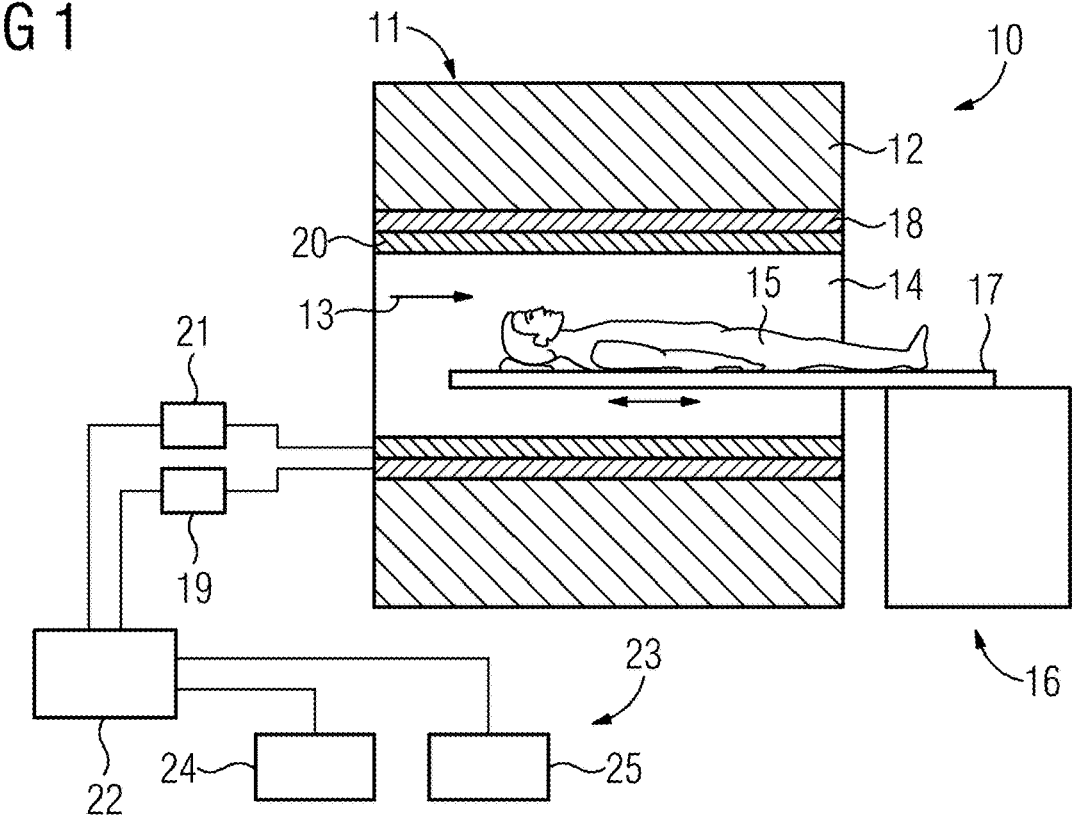
FIG. 1 schematically illustrates a magnetic resonance apparatus according to the invention.

FIG. 1 shows a magnetic resonance (MR) apparatus 10. The magnetic resonance apparatus 10 includes an MR data acquisition scanner 11, which has a superconducting basic field magnet 12 that generates a strong and constant basic magnetic field 13. The scanner 11 has a patient-accommodating region 14 to receive a patient 15. In the present embodiment, the patient-accommodating region 14 is cylindrical in design and is encompassed circumferentially by the scanner 11. A design of the patient-accommodating area 14 that deviates therefrom is also conceivable.

The patient 15 can be moved and/or slid into the patient-accommodating region 14 by a patient-positioning apparatus 16 of the magnetic resonance apparatus 10. The patient-positioning apparatus 16 for this purpose has a moveable patient table 17 within the patient-accommodating region 14.

The scanner 11 further has a gradient coil arrangement 18 that generates magnetic field gradients that are used for spatially encoding MR signals during an imaging procedure. The gradient coil arrangement 18 is controlled by a gradient controller 19 of the magnetic resonance apparatus 10. The scanner 11 further has a radio-frequency (RF) antenna 20. The RF antenna 20 is operated by an RF antenna controller 21 so as to radiate RF magnetic resonance sequences into an examination area that is in the patient-accommodating area 14 of the scanner 10. The radiated RF sequences cause the magnetization of certain nuclear spins in the patient 15 to be deflected from a steady state position established by the basic magnetic field 13. As these excited nuclear spins relax and return to the steady state, they emit MR signals, which are detected by the same antenna that radiated the RF sequences, or by a different antenna.

To control the basic field magnet 12, the gradient controller 19 and the RF antenna controller 21, the magnetic resonance apparatus 10 has a control computer 22. The control computer 22 centrally controls the magnetic resonance apparatus 19, by, for example, running a predetermined gradient echo imaging sequence. In addition, the control computer 22 includes an evaluation processor (not shown) that evaluates medical imaging data that have been acquired during a magnetic resonance examination.

Furthermore, the magnetic resonance apparatus 10 has a user interface 23, which is connected to the control computer 22. Control information, such as imaging parameters, and also reconstructed magnetic resonance images, can be displayed on a display unit 24, for example, on at least one monitor, of the user interface 23 for a medical operator. The user interface 23 further has an input unit 25, via which the information and/or parameters can be entered by the medical technician during a measurement procedure.

Figure 2:
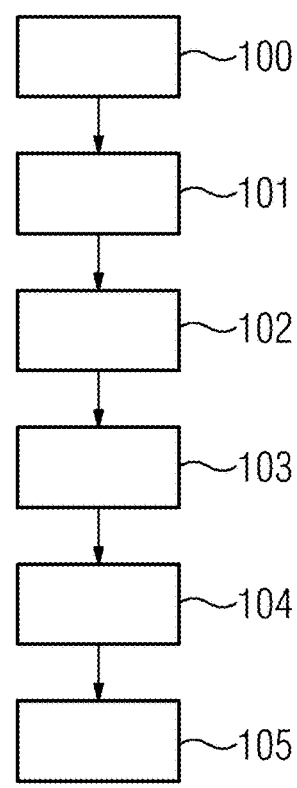
FIG. 2 shows a flowchart of the method according to the invention to support planning of a magnetic resonance examination on a patient.

For a magnetic resonance examination of the patient 15 with the magnetic resonance apparatus 10, the patient 15 is first positioned on the patient-positioning apparatus 16, and where necessary, accessory units required for the magnetic resonance examination, such as an ECG unit and/or an infusion unit and/or local magnetic resonance coil units, are also positioned and/or arranged on the patient-positioning apparatus 16 and/or on the patient 15. Next, a user, in particular a medical technician supervising the magnetic resonance examination, carries out planning of a magnetic resonance examination. In FIG. 2, a method according to the invention to support planning of a magnetic resonance examination on a patient 15 with the magnetic resonance apparatus 10 is shown.

To carry out and/or control the method to support planning of a magnetic resonance examination on a patient 15 with the magnetic resonance apparatus 10, the control computer 22 of the magnetic resonance apparatus 10 is provided with computer programs and/or software, which can be loaded directly into a memory, with program code to cause the method to support planning of a magnetic resonance examination on the patient 15 to be implemented by the magnetic resonance apparatus 10, when the computer programs and/or software are run in the control computer 22. The control unit 22 for this purpose has a processor (not separately shown) that is designed to run the computer programs and/or software, and access the memory, in which the software and/or computer programs are stored.

The software and/or computer code can be stored (encoded) on an electronically readable data carrier that is separate from the control computer 22 and/or on an electronically readable data carrier that is designed as separate from the magnetic resonance apparatus 10. The electronically readable data carrier can be loaded directly into the control computer 22.

For the planning of the magnetic resonance examination on the patient 15, in a first process step 100, a planning image 30 (FIGS. 3 and 4), which includes the partial region of the patient 15 that is to be examined, is provided to the control computer 22. The provision of the planning image 30 can include retrieving and/or opening a planning image 30 of the patient 15 that is already available. Such a planning image 30 can be stored in a memory, for example. Preferably, however, the provision of the planning image 30 of the patient 15 includes acquisition of magnetic resonance data by executing an overview measurement and/or a localizer measurement relating to the patient 15 with the scanner 11. Here, the planning image 30 is preferably established on the basis of the acquired magnetic resonance data from the overview measurement and/or the localizer measurement, the magnetic resonance data relating to the overview measurement and/or the localizer measurement being acquired at a lower resolution than the subsequent magnetic resonance measurement. By the use of the overview measurement and/or the localizer measurement, the partial region of the patient 15 that is of significance and/or is relevant to the impending magnetic resonance examination is preferably imaged.

Figure 3:
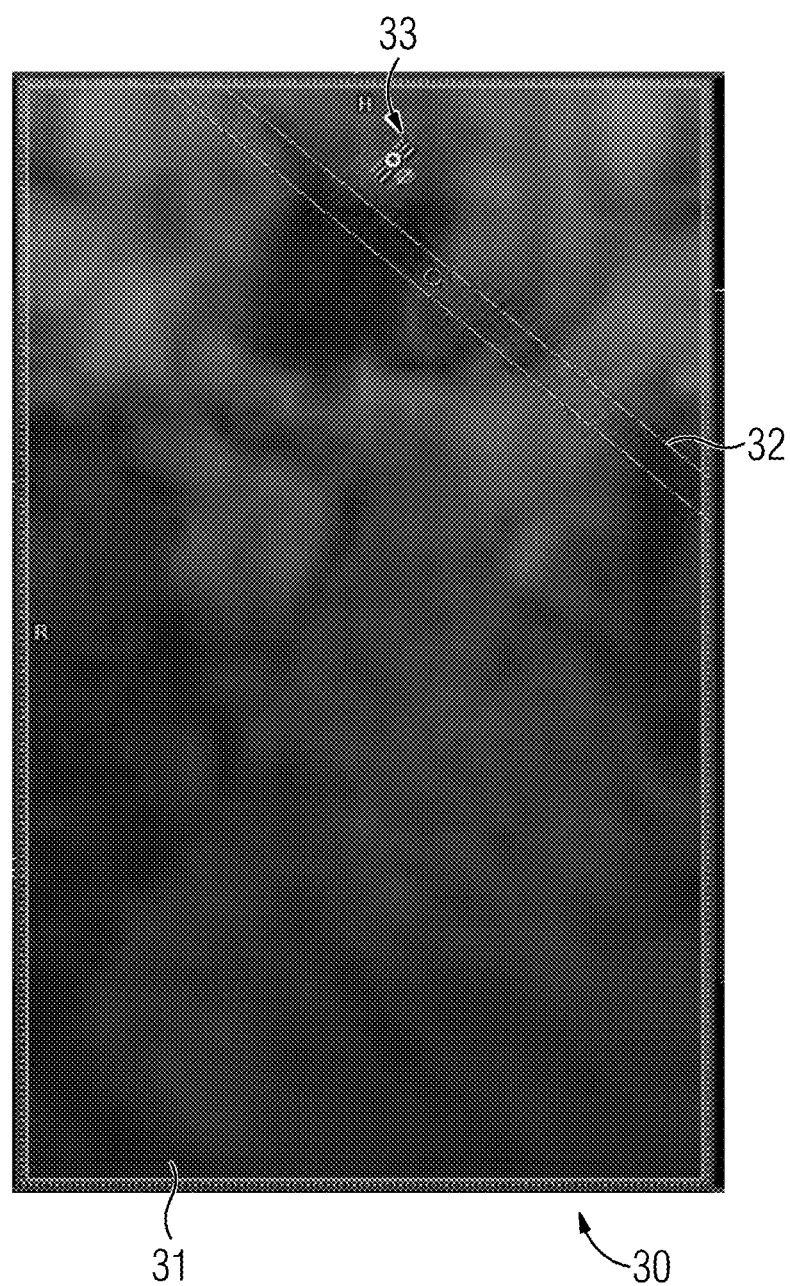
FIG. 3 shows a section of a planning image with only partially displayed graphic protocol objects.

In a subsequent process step 101, a section 31 of the planning image 30 is displayed (depicted). The section 31 preferably displays that part of the patient 15 that is of significance for and/or relevant to the impending magnetic resonance examination. This section 31 is displayed to the user at the output unit 24. With the display of the section 31, the user can visually monitor his or her planning results during the planning of the magnetic resonance examination. In FIG. 3, a section 31 of the planning image 30 that is displayed to the user can be seen.

For the magnetic resonance examination of the patient 15, control parameters are selected as a function of the examination object and/or of a set of clinical questions, in particular as a function of the cause of the examination, by means of the magnetic resonance apparatus. A set of control parameters, based on which the magnetic resonance apparatus 10 can be activated and image data, in particular magnetic resonance data, can be generated, is referred to as a protocol. The image data generated using the control parameters for a protocol preferably have a uniform contrast and preferably represent a partial region of the examination object. For a magnetic resonance examination of the patient 15, the activation of the magnetic resonance apparatus 15 can likewise ensue using a number of protocols.

In addition, in process step 101, in which section 31 of the planning image 30 is displayed, at least one graphic protocol object 32 is also shown superimposed on the planning image 30 at the output unit 24. In the present embodiment, two graphic protocol objects 32 are shown superimposed on the planning image 30 (FIG. 4) and the invention is explained in greater detail using these two graphic protocol objects 32. In alternative variants of the invention, it is also possible for only one single graphic protocol object 32 or for more than two graphic protocol objects 32 to be shown superimposed on the planning image 30.

Using the graphic protocol objects 32, the control parameters of a magnetic resonance protocol that have been entered can be shown in the planning image 30 for the user, for example a medical technician supervising the magnetic resonance examination, for the purpose of monitoring and/or greater clarity. Here, the graphic protocol objects 32 include slice information relating to a slice that is to be measured in the magnetic resonance examination on the patient 15. For example, the slice information can include a position and/or an orientation of the slice that is to be measured and/or a slice width and so on of the slice that is to be measured in the magnetic resonance examination on the patient 15. The position and/or orientation of the slice that is to be measured can be displayed using a position and/or an orientation of the graphic protocol objects 32 within the planning image 30.

The two graphic protocol objects 32 are displayed and/or depicted in the further process step 101 together with the section of the planning image 30 at the output unit 24, insofar as the individual graphic protocol objects 32 are inside the section 31 of the planning image 30. In FIG. 3, the section 31 of the planning image 30 can be seen, only one of the two graphic protocol objects 32 is partially within the section 31, and hence also is displayed together with the section 31 of the planning image 30.

Subsequently, in a further step 102, relative size information relating to the graphic protocol objects 32 is generated. The relative size information is established and/or generated here as a function of a size of the individual graphic protocol objects 32 in relation to the section 31 of the planning image 30. The relative size information can include, for example, information and/or an indication that states what percentage of the respective graphic protocol object 32 is contained and/or depicted inside the section 31 of the planning image 30. In addition, the relative size information can include, for example, information and/or an indication as to whether the section 31 of the planning image 30 is sufficient to show completely the at least one graphic protocol object 32, in the present embodiment the two graphic protocol objects 32. Furthermore, the relative size information can also include an indication and/or information as to whether the at least one graphic protocol object 32, in the present embodiment the two graphic protocol objects 32, is only partially encompassed by the section 31 of the planning image 30 that is displayed, or is entirely outside the section 31 of the planning image 30 that is displayed.

In a further process step 103, there then ensues an output of the relative size information inside the section 31 of the planning image 30 (FIG. 3). Here, the output of the relative size information can include a direct output of the relative size information, which displays the relative size information direct to the user. Alternatively, the output of the relative size information can also include an indirect output of the relative size information, in which only one reference sign 33 is displayed and when the reference sign 33 is traversed, by a mouse cursor, for example, the relative size information is displayed for the user.

In addition, the output of the relative size information can be linked to an input command. Here the input command can be displayed for the user in the form of a direct input symbol. Alternatively, the input command can also be depicted indirectly, such that an input symbol for the input command is only displayed and/or depicted when the input symbol is traversed, for example by a mouse cursor. The input symbol can be included in the reference sign 33. The depiction of the input command in the form of the input symbol preferably ensues only when a size and/or position of the at least one graphic protocol object/objects 32 is not completely displayed inside the section 31 of the planning image 30.

When the input command is activated by the user, in a further process step 104, the section 31 of the planning image 30 is adjusted to a size and/or position of the at least one graphic protocol object 32, in the present embodiment to the two graphic protocol objects 32. In other words, in this instance, section 31 of the planning image 30 is enlarged such that the graphic protocol objects 32 are completely displayed. The adjustment of the section 31 of the planning image 30 to a size and/or position of the at least one graphic protocol object 32 preferably ensues automatically and/or autonomously by the control computer 22.

Figure 4:
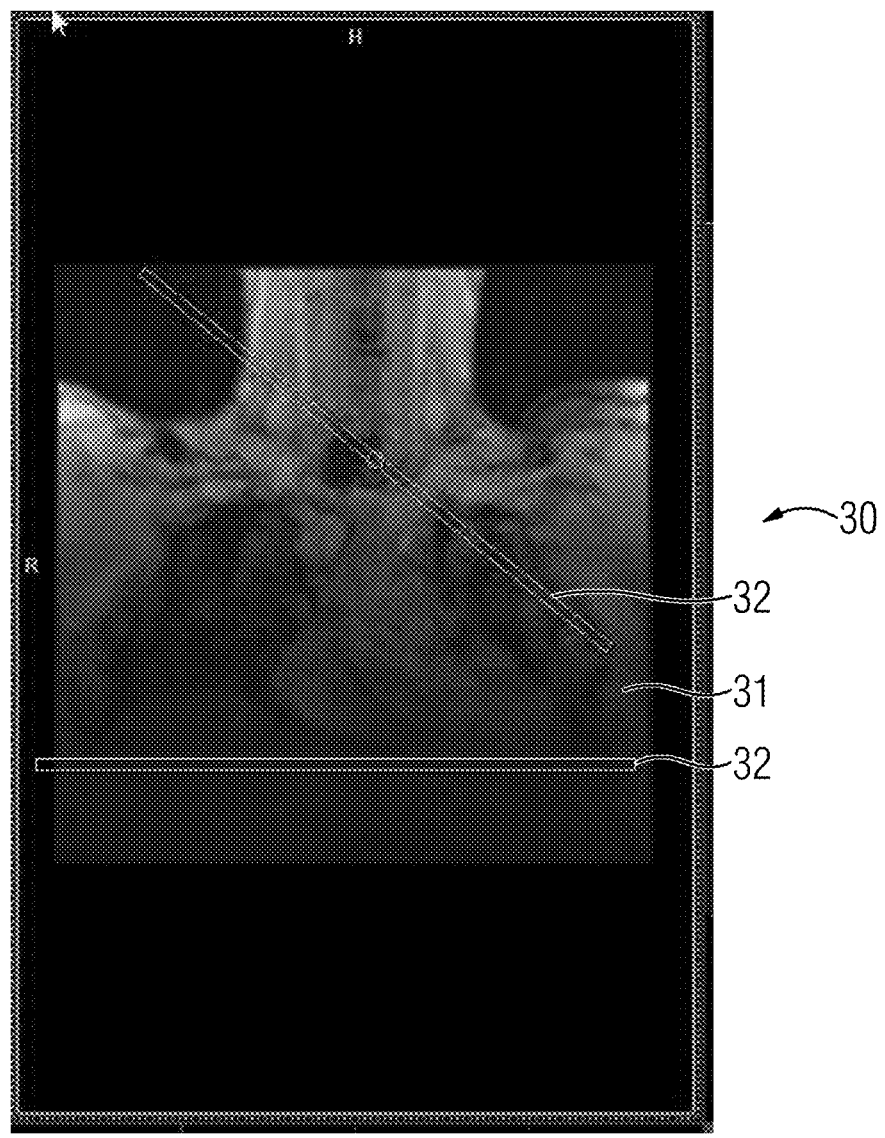
FIG. 4 shows an adjusted section of the planning image with graphic protocol objects displayed completely.

The adjusted section 31 of the planning image 30 is then, in a further process step 105, displayed together with the complete graphic protocol object 32 at the output unit 24 (FIG. 4).

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method to support planning of a magnetic resonance (MR) examination of a subject with an MR apparatus comprising:

providing a computer with a planning image that comprises a partial region of a subject to be examined in a magnetic resonance examination with a magnetic resonance apparatus;

at a display screen in communication with said computer, displaying a section of the planning image;

with said computer, superimposing at least one graphic protocol object on the displayed planning image at said display screen and thereby depicting said at least one graphic protocol object at said display screen so that it can be seen whether, and to what extent, the displayed graphic protocol object is inside the displayed section of the planning image;

in said computer, generating relative size information for said graphic protocol object dependent on at least one of a size and a position of the graphic protocol object in relation to the section of the planning image;

from said computer, causing the generated relative size information to be shown in the displayed planning image at the display screen;

in said computer, linking display of said relative size information at said display screen to an input command that can be provided as an input into the computer; and formulating said input command as an activatable input command and, when said input command is activated, adjusting the section of the planning image at said display screen to at least one of a size or position of said at least one graphic protocol object displayed at said display screen.

2. A method as claimed in claim 1 comprising generating said at least one graphic protocol object in said computer as slice information for a slice of the examination subject from which MR data are to be acquired in said MR examination.

3. A method as claimed in claim 1 comprising generating said relative size information so as to indicate at said display screen whether the section of the planning image is sufficient in order to completely show said at least one graphic protocol object at said display screen.

4. A method as claimed in claim 1 comprising displaying the adjusted section of the planning image at said display screen together with the complete graphic protocol object.

5. A magnetic resonance (MR) apparatus comprising:
an MR data acquisition scanner;
a computer provided with a planning image that comprises a partial region of a subject to be examined in a magnetic resonance examination with the magnetic resonance data acquisition scanner,
a display screen in communication with said computer, at which said computer is configured to display a section of the planning image;
said computer being configured to superimpose at least one graphic protocol object on the displayed planning image at said display screen and thereby depict said at least one graphic protocol object at said display screen so that it can be seen whether, and to what extent, the displayed graphic protocol object is inside the displayed section of the planning image;
said computer being configured to generate relative size information for said graphic protocol object dependent on at least one of a size and a position of the graphic protocol object in relation to the section of the planning image;
said computer being configured to cause the generated relative size information to be shown in the displayed planning image at the display screen;
said computer being configured to link display of said relative size information at said display screen to an input command that can be provided as an input into the computer; and
said computer being configured to formulate said input command as an activatable input command and, when said input command is activated, adjust the section of the planning image at said display screen to at least one of a size or position of said at least one graphic protocol object displayed at said display screen.

6. A non-transitory, computer-readable data storage medium encoded with programming instructions, said storage medium being loaded into a computer of a magnetic resonance (MR) apparatus having an MR data acquisition scanner, and said programming instructions causing said computer to:
receive a planning image that comprises a partial region of a subject to be examined in a magnetic resonance examination with the magnetic resonance data acquisition scanner,
at a display screen in communication with said computer, display a section of the planning image;
superimpose at least one graphic protocol object on the displayed planning image at said display screen and thereby depicting said at least one graphic protocol object at said display screen so that it can be seen whether, and to what extent, the displayed graphic protocol object is inside the displayed section of the planning image;
generate relative size information for said graphic protocol object dependent on at least one of a size and a position of the graphic protocol object in relation to the section of the planning image;
cause the generated relative size information to be shown in the displayed planning image at the display screen;
link display of said relative size information at said display screen to an input command that can be provided as an input into the computer; and
formulate said input command as an activatable input command and, when said input command is activated, adjusting the section of the planning image at said display screen to at least one of a size or position of said at least one graphic protocol object displayed at said display screen.

\* \* \* \* \*